United States Patent
Choi et al.

(10) Patent No.: US 6,566,704 B2
(45) Date of Patent: May 20, 2003

(54) VERTICAL NANO-SIZE TRANSISTOR USING CARBON NANOTUBES AND MANUFACTURING METHOD THEREOF

(75) Inventors: Won-bong Choi, Suwon (KR); Jo-won Lee, Suwon (KR); Young-hee Lee, Jeonju (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 34 days.

(21) Appl. No.: 09/891,240

(22) Filed: Jun. 27, 2001

(65) Prior Publication Data
US 2002/0001905 A1 Jan. 3, 2002

(30) Foreign Application Priority Data
Jun. 27, 2000 (KR) ......................... 2000-35703

(51) Int. Cl.$^7$ ......................... H01L 21/8238
(52) U.S. Cl. ................. 257/314; 257/24; 257/30; 257/213; 257/328; 257/368; 438/156; 438/173; 438/206; 438/268
(58) Field of Search ............... 438/156, 158, 438/173, 192, 206, 212, 268; 257/213, 220, 242, 263, 278, 302, 328, 314, 368, 499, 565, 24, 30

(56) References Cited

U.S. PATENT DOCUMENTS

| | | | |
|---|---|---|---|
| 6,038,060 A | * | 3/2000 | Crowley ................ 359/328 |
| 6,340,822 B1 | * | 1/2002 | Brown et al. ............... 257/25 |
| 6,359,288 B1 | * | 3/2002 | Ying et al. ................. 257/14 |
| 6,459,095 B1 | * | 10/2002 | Heath et al. ................ 257/14 |
| 6,465,813 B2 | * | 10/2002 | Ihm ......................... 257/183 |
| 6,472,705 B1 | * | 10/2002 | Bethune et al. ........... 257/314 |
| 2001/0023986 A1 | * | 9/2001 | Mancevski ................ 257/741 |
| 2002/0020841 A1 | * | 2/2002 | Ihm ........................... 257/77 |
| 2002/0130311 A1 | * | 9/2002 | Lieber et al. ................. 257/1 |

* cited by examiner

Primary Examiner—Matthew Smith
Assistant Examiner—Renzo N. Rocchegiani
(74) Attorney, Agent, or Firm—Lee & Sterba, P.C.

(57) ABSTRACT

The present invention provide a vertical nano-sized transistor using carbon nanotubes capable of achieving high-density integration, that is, tera-bit scale integration, and a manufacturing method thereof, wherein in the vertical nano-sized transistor using carbon nanotubes, holes having diameters of several nanometers are formed in an insulating layer and are spaced at intervals of several nanometers. Carbon nanotubes are vertically aligned in the nano-sized holes by chemical vapor deposition, electrophoresis or mechanical compression to be used as channels. A gate is formed in the vicinity of the carbon nanotubes using an ordinary semiconductor manufacturing method, and then a source and a drain are formed at lower and upper parts of each of the carbon nanotubes thereby fabricating the vertical nano-sized transistor having an electrically switching characteristic.

3 Claims, 13 Drawing Sheets

VERTICAL NANO-SIZE TRANSISTOR USING CARBON NANOTUBES AND MANUFACTURING METHOD THEREOF

BACKGROUND OF THE INVENTION

1. Field of the Invention

The present invention relates to a vertical nano-sized transistor and a method for manufacturing the same. More specifically, the present invention relates to a vertical nano-sized transistor using carbon nanotubes capable of achieving high-density, or tera-bit scale, integration and a method for manufacturing the same.

2. Description of the Related Art

A switching device fabricated using a conventional silicon substrate is generally constructed such that an impurity diffusion region, an isolation region and a channel region are horizontally connected on the silicon substrate. An integrated circuit consisting of multiple switching devices is constructed such that the individual switching devices are horizontally arranged to be highly integrated. A problem arising from forming an impurity diffusion region and an isolation region on a silicon substrate is that there are limits in processing precision and integration. A result of the limitations imposed by forming an impurity diffusion region and an isolation region on a silicon substrate is the difficulty to decrease the size of the switching device.

A metal oxide semiconductor field effect transistor (MOSFET) is one of the most typically used fine switching devices. The area of a 256 Mega DRAM having a minimum pattern size of 0.25 $\mu$m is approximately 0.72 $\mu m^2$; the area of a 1 Giga DRAM having a minimum pattern size of 0.18 $\mu$m is approximately 0.32 $\mu m^2$; the area of a 4 Giga DRAM having a minimum pattern size of 0.13 $\mu$m is approximately 0.18 $\mu m^2$, and the area of a 16 Giga DRAM having a minimum pattern size of 0.1 $\mu$m is approximately 0.1 $\mu m^2$.

In order to overcome problems in miniaturizing conventional switching devices, a switching device using carbon nanotubes has been proposed. However, the proposed device still has a horizontal structure similar to that of other conventional switching devices making it quite difficult to control the individual carbon nanotubes.

As a result, it is difficult to achieve high-density integration of switching devices using carbon nanotubes.

SUMMARY OF THE INVENTION

In order to solve the aforementioned problems, it is a feature of an embodiment of the present invention to provide by vertical growth and selective deposition a vertical transistor ranging in size from several tens of nanometers to one micron using tera-bit scale carbon nanotubes as channels where each of the carbon nanotubes has a diameter of several nanometers and is grown on a nonconductive substrate having nano-sized holes. The lower and upper parts of each carbon nanotube are connected to a source and a drain, respectively, with a gate interposed between the source and the drain for performing switching.

It is another feature of an embodiment of the present invention to provide a method of manufacturing the vertical nano-sized transistor.

In order to provide for these and other features of the present invention, there is provided a vertical nano-sized transistor using carbon nanotubes including an insulating layer preferably formed of one material selected from $Al_2O_3$ and Si, the insulating layer having holes with nano-sized diameters; carbon nanotubes vertically aligned in the holes; gates formed over the insulating layer in the vicinity of the carbon nanotubes; a nonconductor film deposited on the gates to fill the holes; drains formed over the nonconductor film and the carbon nanotubes; and sources formed under the insulating layer and the carbon nanotubes. The sources and the drains are preferably formed of metal films.

According to another feature of an embodiment of the present invention, there is provided a method of manufacturing a vertical nano-sized transistor using carbon nanotubes by forming sources on a semiconductor substrate; forming an insulating layer using a nonconductor material, and the nonconductor material being preferably $Al_2O_3$ or Si; forming holes in portions of the insulating layer corresponding to the sources, the holes having nano-sized diameters and being spaced at intervals of several nanometers; vertically growing carbon nanotubes on the sources in the holes achieved preferably by one method selected from chemical vapor deposition (CVD), electrophoresis and mechanical compression; forming gates in the vicinity of the carbon nanotubes; depositing a nonconductor film over the gates to fill the holes; and forming drains over the nonconductor film and the carbon nanotubes.

Another feature of an embodiment of the present invention provides a vertical nano-sized transistor using carbon nanotubes including an insulating layer formed preferably of either $Al_2O_3$ or Si, and the insulating layer having holes with nano-sized diameters; carbon nanotubes vertically aligned in the holes; drains formed over the insulating layer and the carbon nanotubes; a nonconductor film deposited on the drains; gates formed over the nonconductor film; and sources formed under the insulating layer and the carbon nanotubes. The sources and the drains are preferably formed of metal films.

Still another feature of an embodiment of the present invention provides a method of manufacturing a vertical nano-sized transistor using carbon nanotubes by forming sources on a semiconductor substrate; forming an insulating layer using a nonconductor material preferably of either $Al_2O_3$ or Si; forming holes in portions of the insulating layer corresponding to the sources, the holes having nano-sized diameters and being spaced at intervals of several nanometers; vertically growing carbon nanotubes on the sources in the holes, achieved preferably by one method selected from chemical vapor deposition (CVD), electrophoresis and mechanical compression; forming drains over the nonconductor film and the carbon nanotubes; depositing a nonconductor film over the drains; and forming gates over the nonconductor film.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which:

FIGS. 5A and 5B illustrate scanning electron microscope (SEM) micrographs of carbon nanotubes vertically grown during the manufacture of a vertical nano-sized transistor according to the present invention, in which FIG. 5A shows carbon nanotubes of approximately 50 nm in diameter, and FIG. 5B shows carbon nanotubes of approximately 20 nm in diameter;

DETAILED DESCRIPTION OF THE PREFERRED EMBODIMENTS

Korean Patent Application No. 00-35703, filed on Jun. 27, 2000, and entitled: "Vertical Nano-sized Transistor Using Carbon Nanotubes and Manufacturing Method Thereof," is incorporated by reference herein in its entirety.

A vertical nano-sized transistor using carbon nanotubes according to the present invention and a manufacturing method thereof will now be described in detail with reference to the accompanying drawings.

Figure 1:
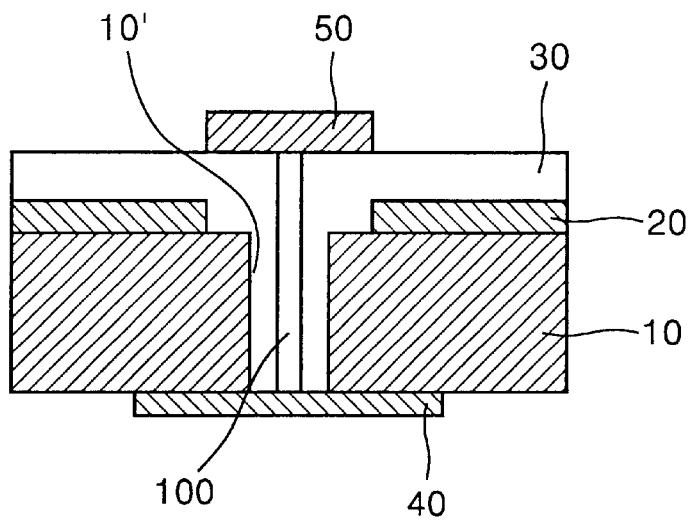
FIG. 1 illustrates a vertical cross-sectional view of a vertical nano-sized transistor using carbon nanotubes according to a first embodiment of the present invention.

A vertical nano-sized transistor using carbon nanotubes according to the first embodiment of the present invention will now be explained. As shown in FIG. 1, a unit cell of a vertically aligned carbon nanotube transistor is constructed as follows.

First, a carbon nanotube 100 is arranged on a nonconductor substrate 10 having a nano-sized hole 10' formed by vertical growth and selective deposition. A gate 20 is formed on the nonconductor substrate 10 in the vicinity of the carbon nanotube 100, and a nonconductor film 30 is deposited thereon to fill the hole 10'. Here, an insulating film such as alumina is used as the nonconductor substrate 10, and the size of the hole and the distance between adjacent holes can be adjusted to dimensions of several nanometers. In such a manner, high-density integration, that is, tera-bit scale integration, can be achieved.

Figure 2:
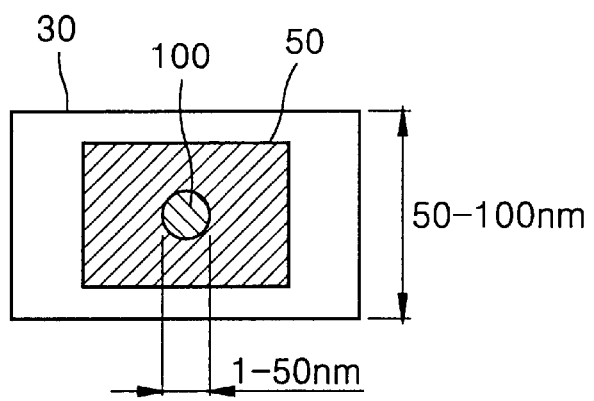
FIG. 2 illustrates a plan view of the vertical nano-sized transistor shown in FIG. 1.

In other words, the vertically grown carbon nanotube 100 having a nano-sized diameter is used as a channel and is constructed such that the lower and upper parts thereof are connected to a source 40 and a drain 50, respectively, with the gate 20 being interposed therebetween, so that switching can be performed. Since the size of a transistor can be made to be in the range of from several tens of nanometers to one micron or less, high-density integration can be achieved. Referring to FIG. 2, which illustrates a plan view of the vertical nano-sized transistor shown in FIG. 1, the diameter of a carbon nanotube ranges from 1 to 200 nm, preferably 1–50 nm, and the width of the nonconductor film 30 ranges from 50 to 500 nm, preferably 50–100 nm.

The vertical nano-sized transistor using the thus-constructed carbon nanotube is characterized in that electrons are supplied from the source 40 to minutely control the current according to the voltage applied to the gate 20 to then be emitted to the drain 50. Since the unit cell is nano-sized, the current can be controlled with a small amount of load, therefore, the nano-sized transistor has an advantage of a low-power characteristic.

According to another embodiment of the present invention, a method of manufacturing a vertical nano-sized transistor using carbon nanotubes will now be described with reference to FIGS. 3A through 3F, which illustrate vertical cross-sectional views of the processing steps.

Figure 3A:
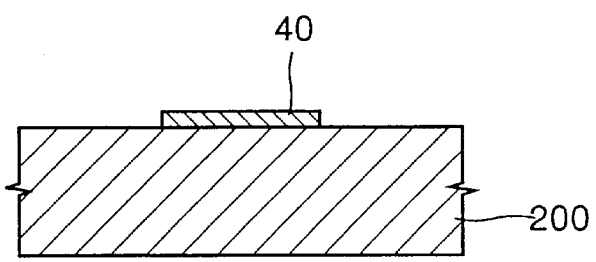
FIGS. 3A through 3F illustrate vertical cross-sectional views of processing steps in a method of manufacturing a vertical nano-sized transistor using carbon nanotubes according to the present invention.

As shown in FIG. 3A, a source 40 is formed on a semiconductor substrate 200.

Figure 3B:
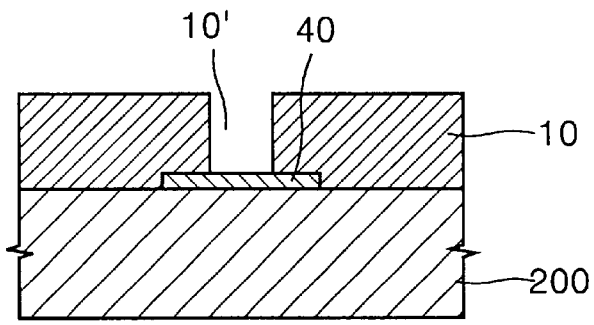

Then, as shown in FIG. 3B, an insulating layer 10 is formed using a nonconductor such as $Al_2O_3$ or Si, and a hole 10' is formed in a portion of the insulating layer 10 above the source 40.

Figure 3C:
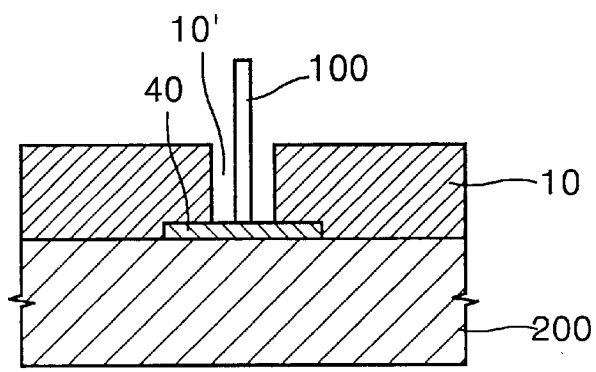

As shown in FIG. 3C, a carbon nanotube 100 is vertically grown on the source 40 in the hole 10' by CVD, electrophoresis or mechanical compression. In other words, the hole 10' is formed and the carbon nanotube 100 is then selectively grown only in the hole 10'.

Figure 3D:
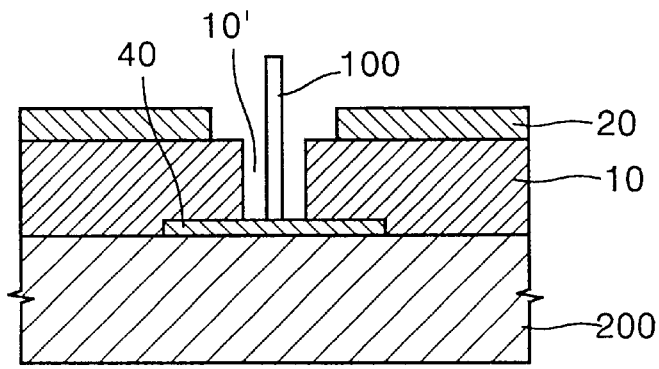

Next, as shown in FIG. 3D, a gate 20 is formed in the vicinity of the carbon nanotube 100.

Figure 3E:
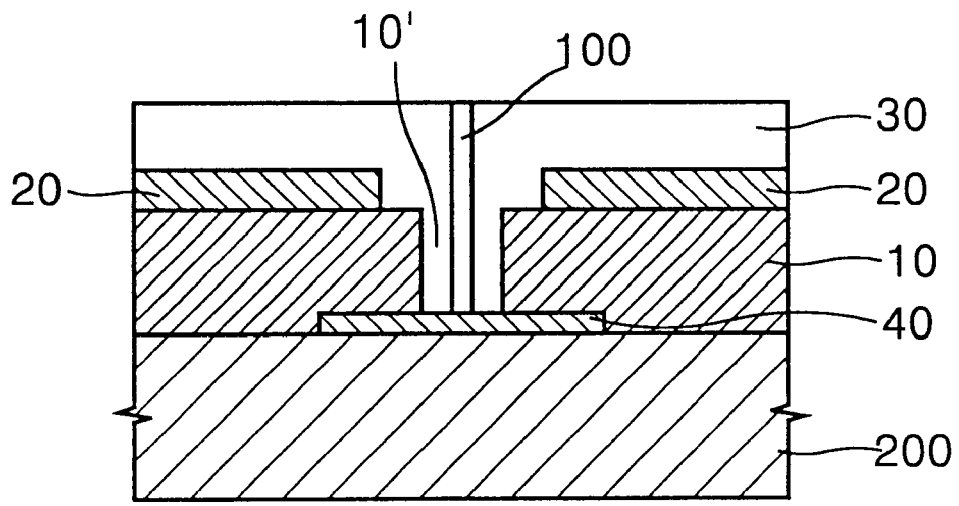

As shown in FIG. 3E, a nonconductor film 30 is deposited over the gate 20 to fill the hole 10'.

Figure 3F:
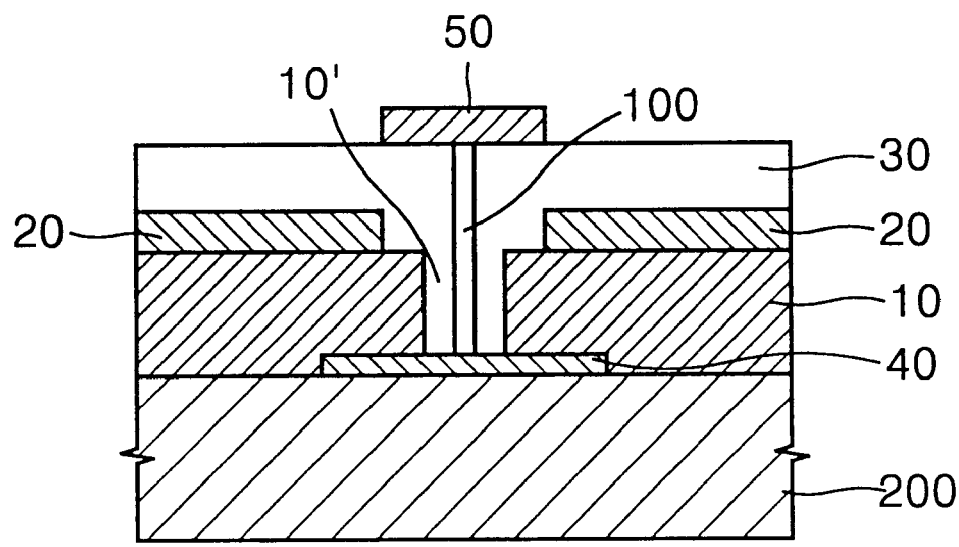

Finally, as shown in FIG. 3F, a drain 50 is formed over the nonconductor film 30 and the carbon nanotube 100, thereby completing a vertical nano-sized transistor.

A vertical nano-sized transistor using carbon nanotubes according to a second embodiment of the present invention, which is the same as the vertical nano-sized transistor according to the first embodiment except that a gate 20 is formed over a drain 50, will now be described with reference to FIGS. 4A and 4B.

First, carbon nanotubes 100 are grown on a nonconductor substrate 10 having nano-sized holes (not shown) and arranged by vertical growth and selective deposition. A source 40 and the drain 50 are connected to the lower and upper parts of the carbon nanotubes 100. A nonconductor film 30 is formed over the drain 50, and the gate 20 is formed on the nonconductor film 30. Here, the nonconductor film 30 is preferably formed of $SiO_2$.

Using the thus-vertically grown carbon nanotubes 100 having nano-sized diameters as channels, the lower and upper parts thereof are connected to the source 40 and the drain 50, respectively. The gate 20 is arranged over the drain 50, and switching is then performed.

Figure 4A:
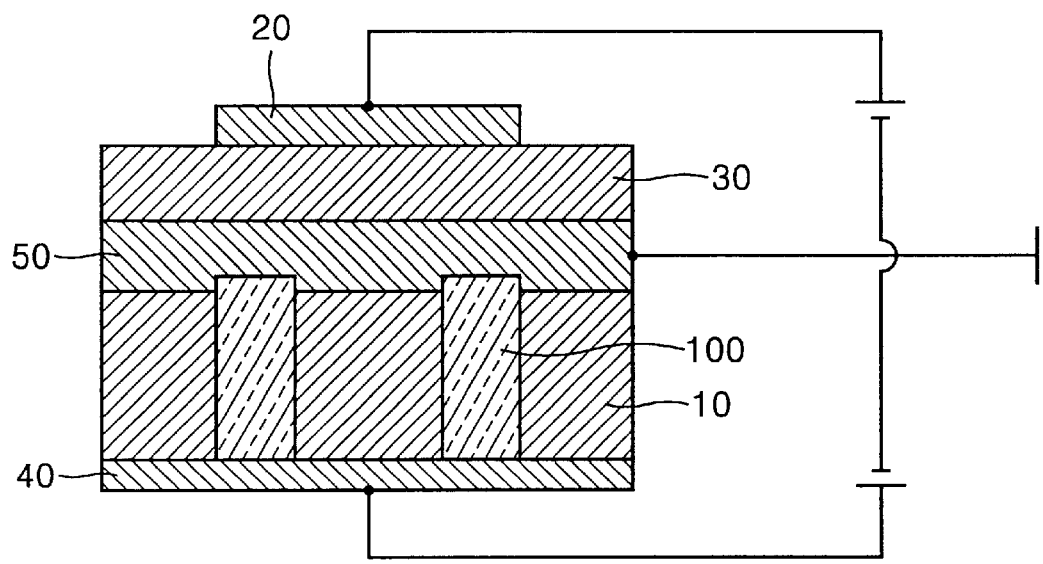
FIGS. 4A and 4B illustrate a vertical cross-sectional view and a perspective view of a vertical nano-sized transistor using carbon nanotubes according to a second embodiment of the present invention.
Figure 4B:
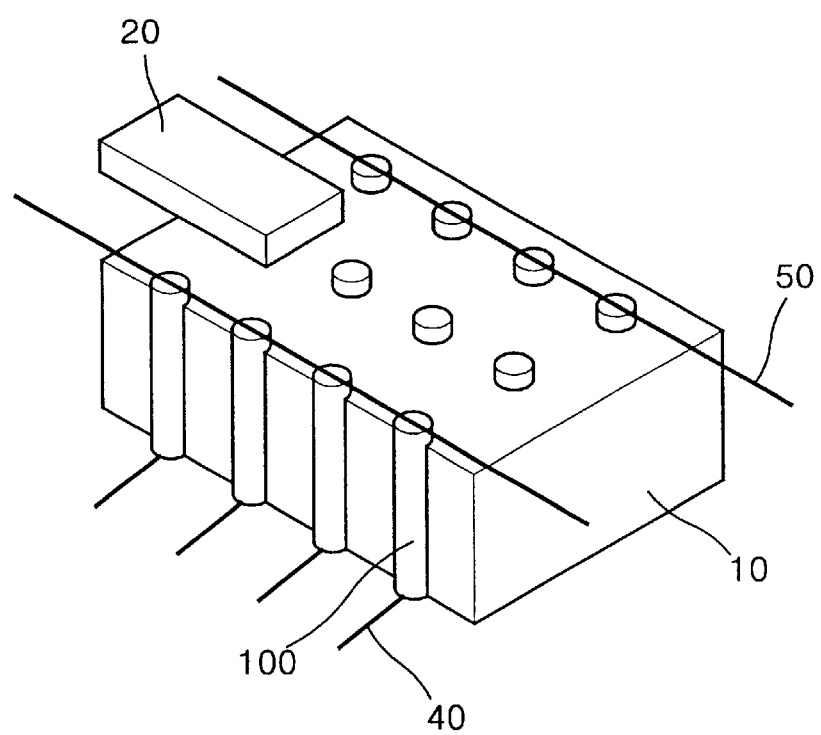

FIG. 4B illustrates a perspective view of the vertical nano-sized transistor using carbon nanotubes shown in FIG. 4A, in which a source line and a drain line intersect at locations where the carbon nanotubes are grown to form unit cells. Also, the gate line turns current on or off in a state such that it does not contact the drain line.

The manufacturing methods of vertical nano-sized transistors using carbon nanotubes according to the first and second embodiments of the present invention are similar up to the step of growing the carbon nanotubes 100, but are different in the positional relationship between the gate 20 and the drain 50. According to the second embodiment, the drain 50 is formed over the insulating layer 10 and the carbon nanotubes 100 after forming the carbon nanotubes in the insulating layer 10; the gate 20 is subsequently formed over the drain 50. The second embodiment differs from the first embodiment in that the gate 20 is formed between the source 40 and the drain 50.

In the second embodiment, after forming the drain 50, the nonconductor layer 30 is formed thereon. Finally, the gate 20 is formed on the nonconductor layer 30, thereby completing a vertical nano-sized transistor.

Figure 5A:
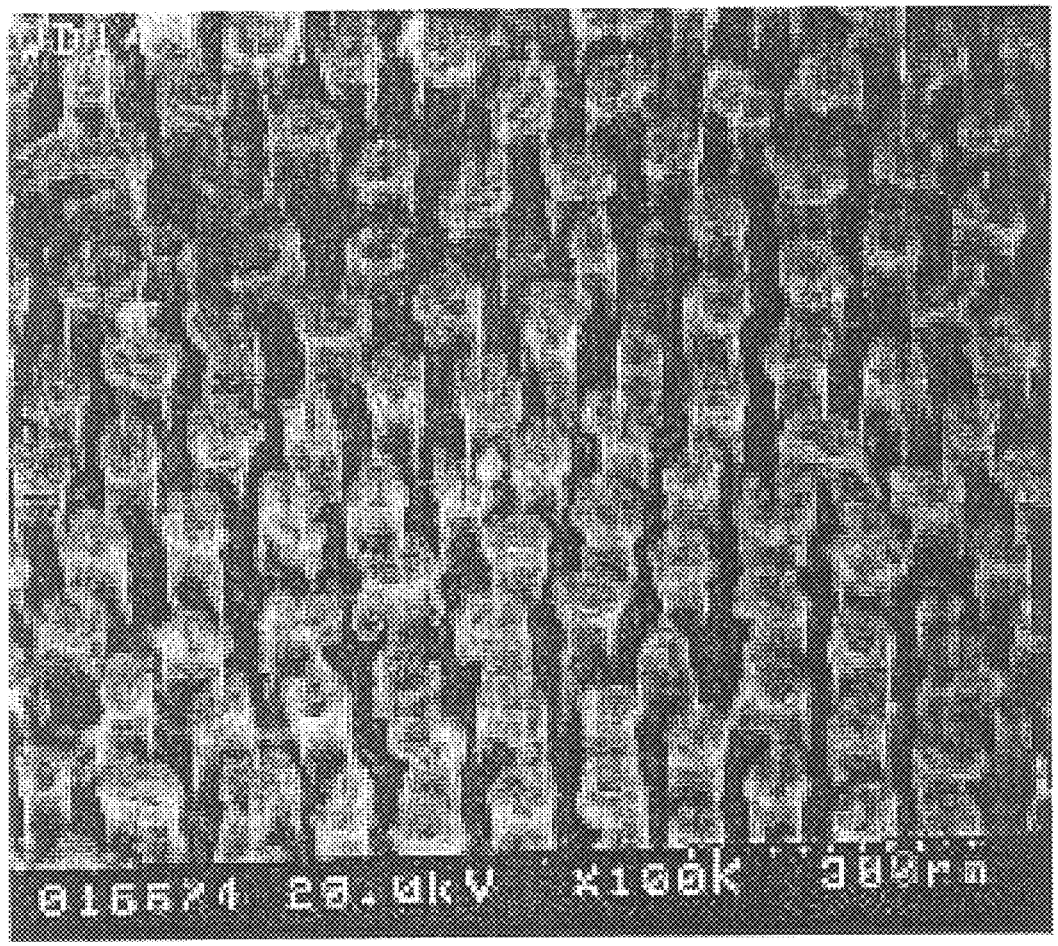
Figure 5B:
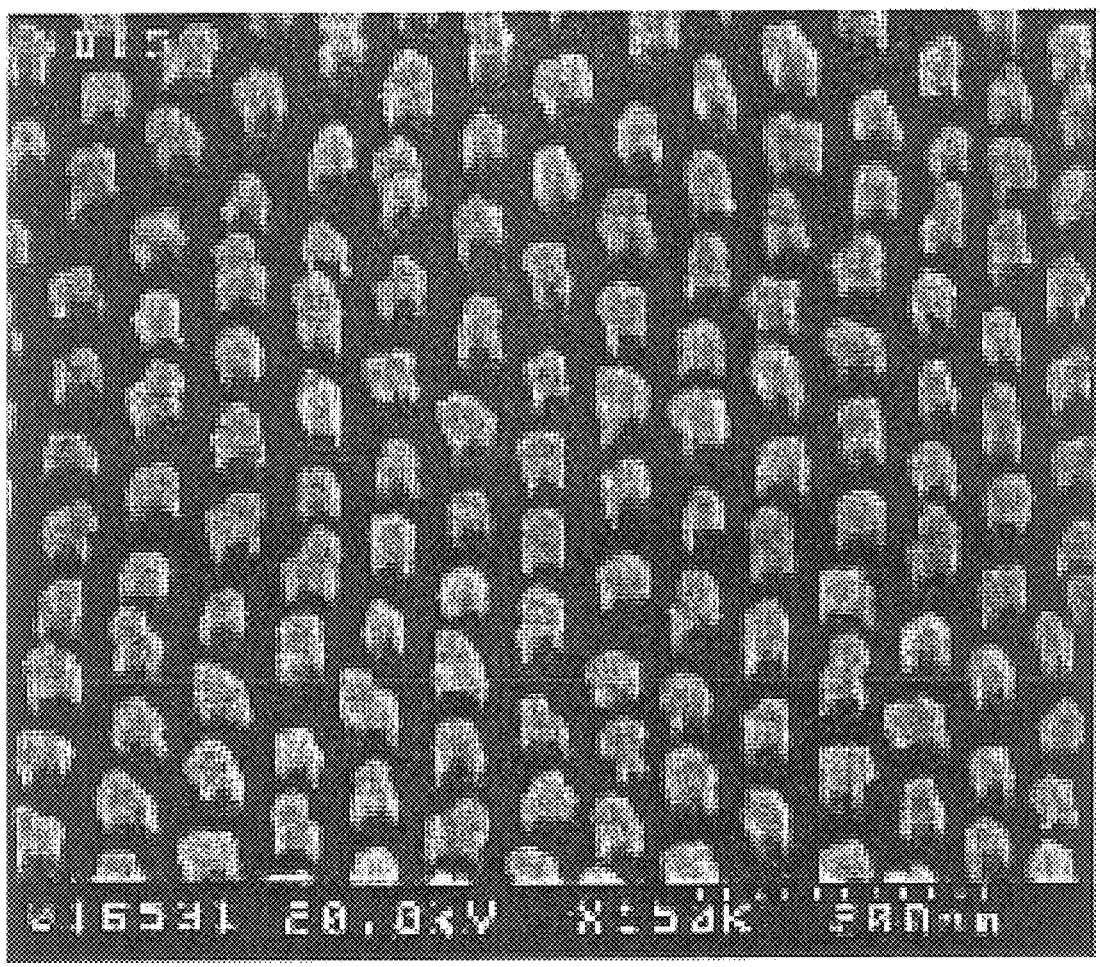

FIGS. 5A and 5B depict SEM micrographs of carbon nanotubes vertically grown during the manufacture of the vertical nano-sized transistor according to an embodiment of the present invention. FIG. 5A shows carbon nanotubes of approximately 50 nm in diameter and FIG. 5B shows a carbon nanotubes of approximately 20 nm in diameter.

Figure 6A:
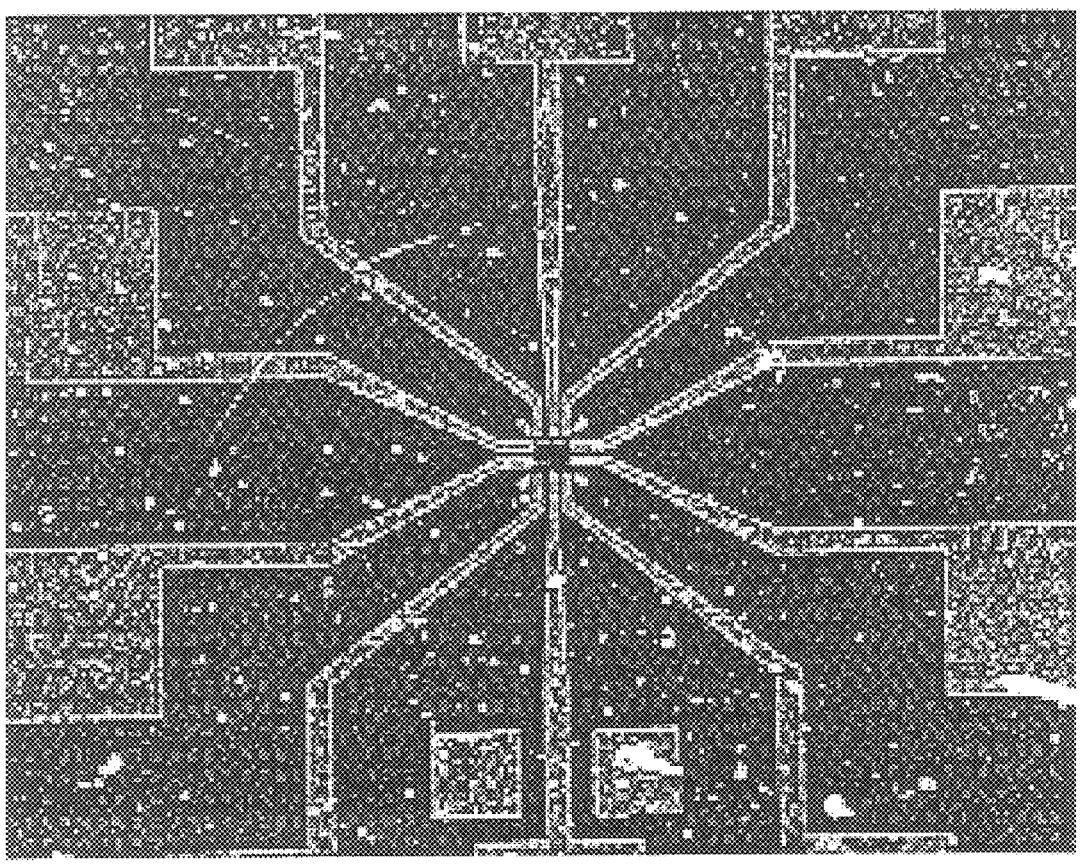
FIG. 6A illustrates a SEM micrograph of an electrode pattern using vertically grown carbon nanotubes, formed using e-beam lithography.
Figure 6B:
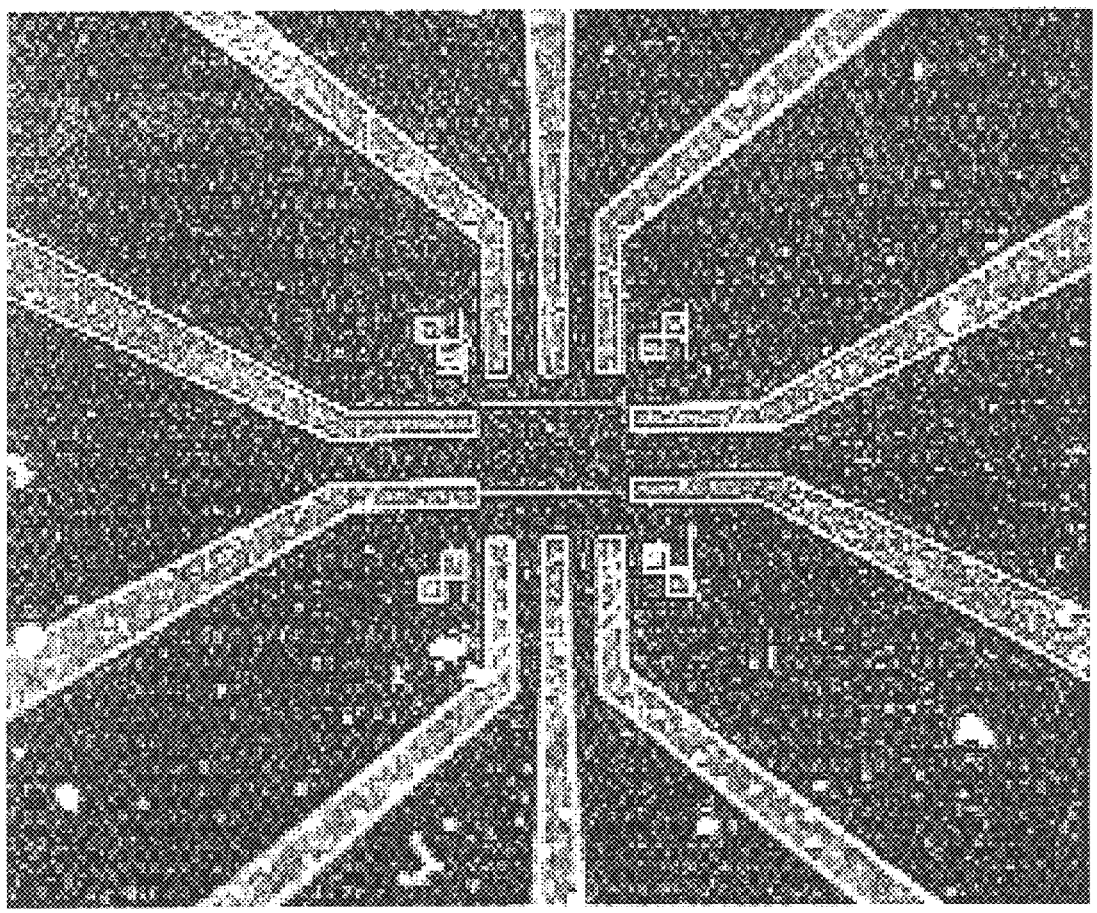
FIG. 6B illustrates an enlarged view of FIG. 6A.

FIG. 6A depicts a SEM micrograph of an electrode pattern using vertically grown carbon nanotubes, formed using e-beam lithography, and FIG. 6B is an enlarged view of FIG. 6A. Referring to FIGS. 6A and 6B, it is understood that the carbon nanotube vertically grown in the center of the electrode pattern is connected with metal electrodes.

Figure 7:
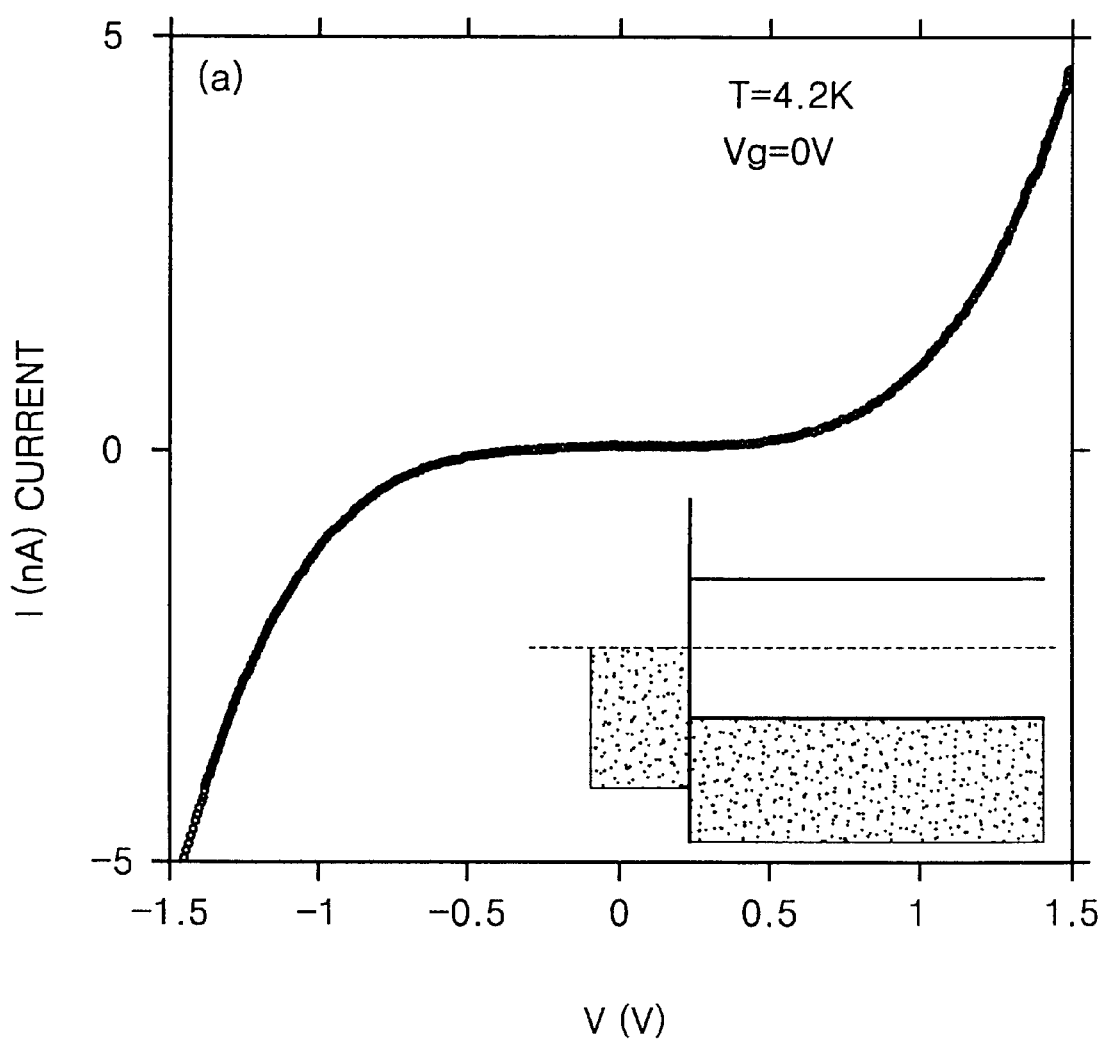
FIG. 7 illustrates an I-V characteristic curve of a vertical nano-sized transistor using carbon nanotubes according to an embodiment of the present invention.

FIG. 7 is an I-V characteristic curve of a vertical nano-sized transistor using carbon nanotubes according to the present invention. It is understood that an energy band gap exists during measurement of low-temperature electrical conductivity and that the carbon nanotubes exhibit transistor-like characteristics.

Figure 8A:
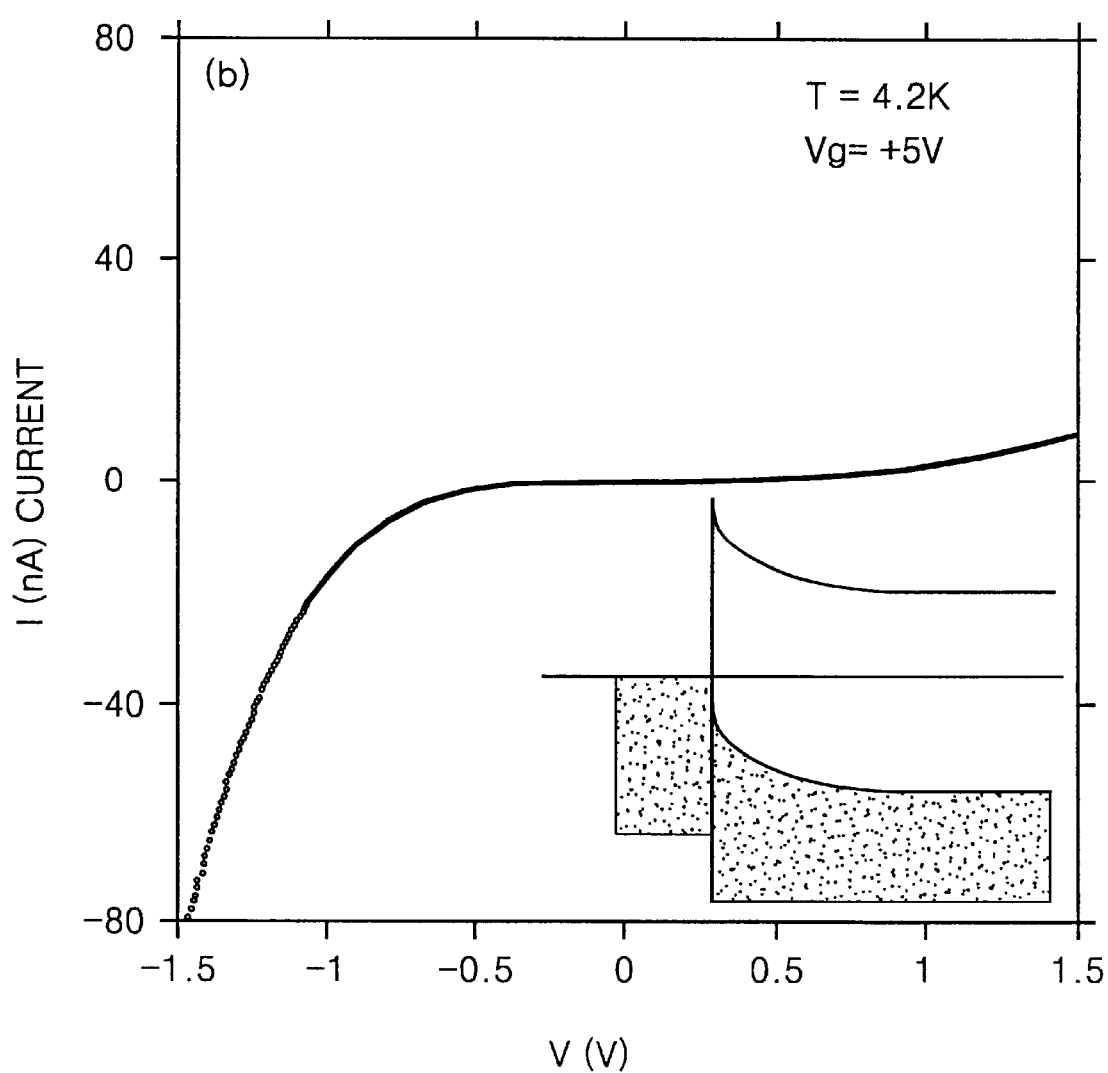
FIGS. 8A and 8B illustrate I-V characteristic curves when a bias voltage is applied to a gate of the vertical nano-sized transistor according to the second embodiment of the present invention.
Figure 8B:
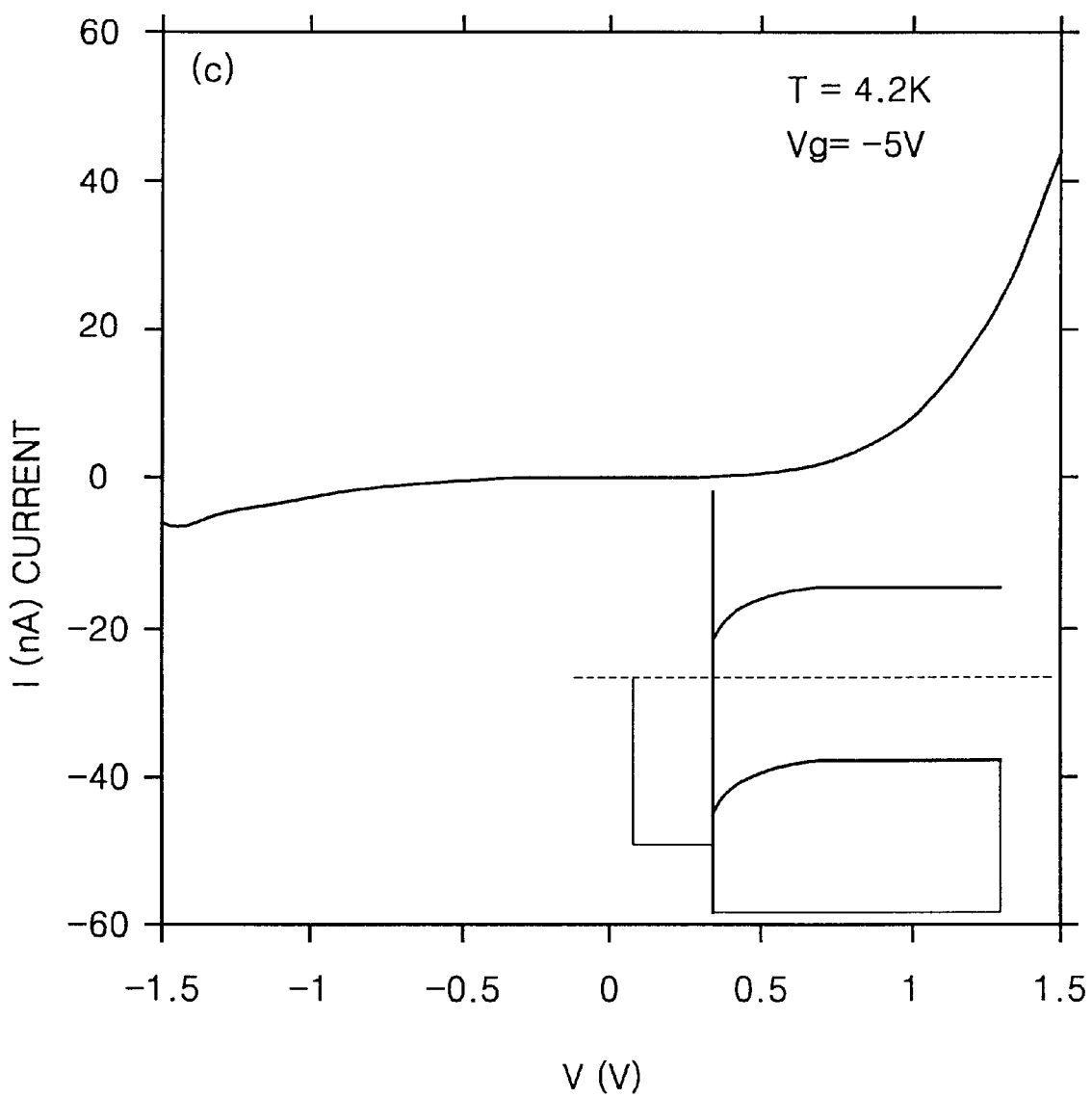

FIGS. 8A and 8B are I-V characteristic curves of a vertical nano-sized transistor using carbon nanotubes when a bias voltage is applied to the gate of the vertical nano-sized transistor according to the second embodiment of the present invention. FIG. 8A shows a case where a positive bias is applied and FIG. 8B shows a case where a negative bias is applied. Referring to FIGS. 8A and 8B, it is understood that current flows in only one direction.

Figure 9A:
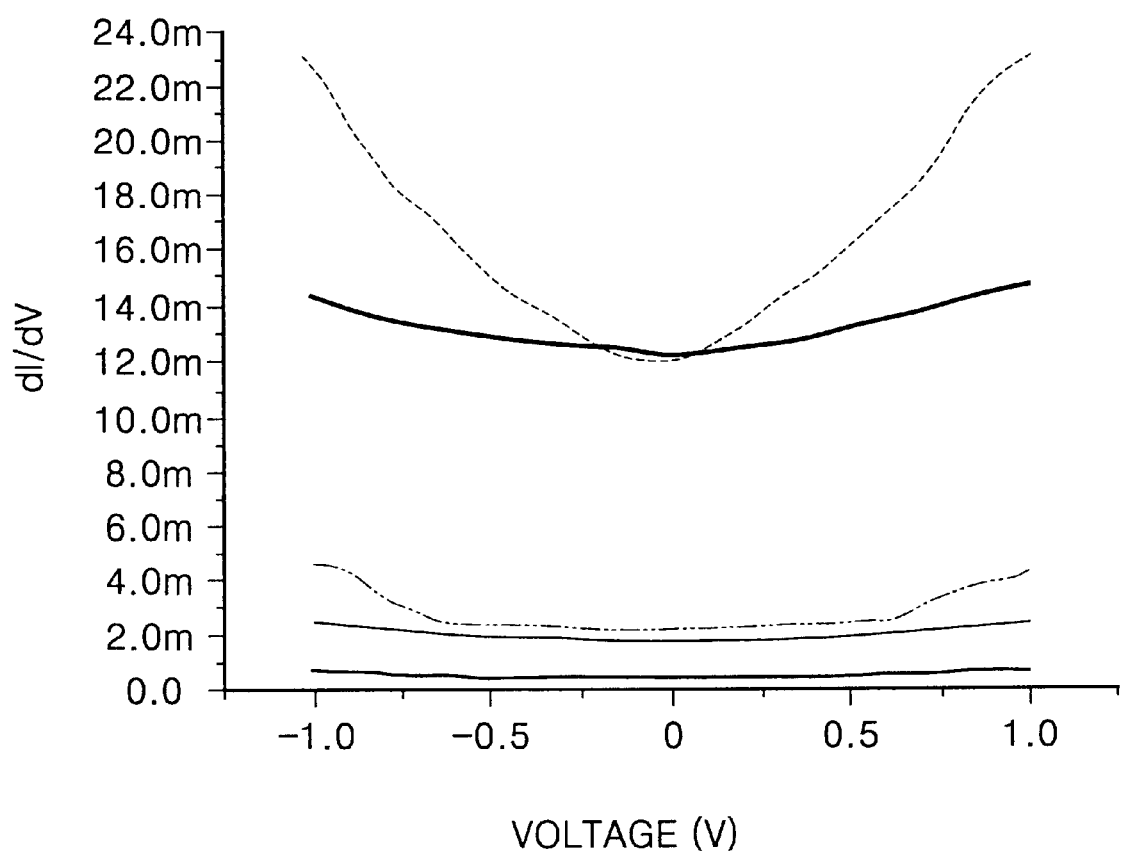
FIGS. 9A and 9B illustrate I-V characteristic curves of carbon nanotube samples having diameters of approximately 20 nm, the carbon nanotubes annealed at approximately 400° C. to approximately 800° C.
Figure 9B:
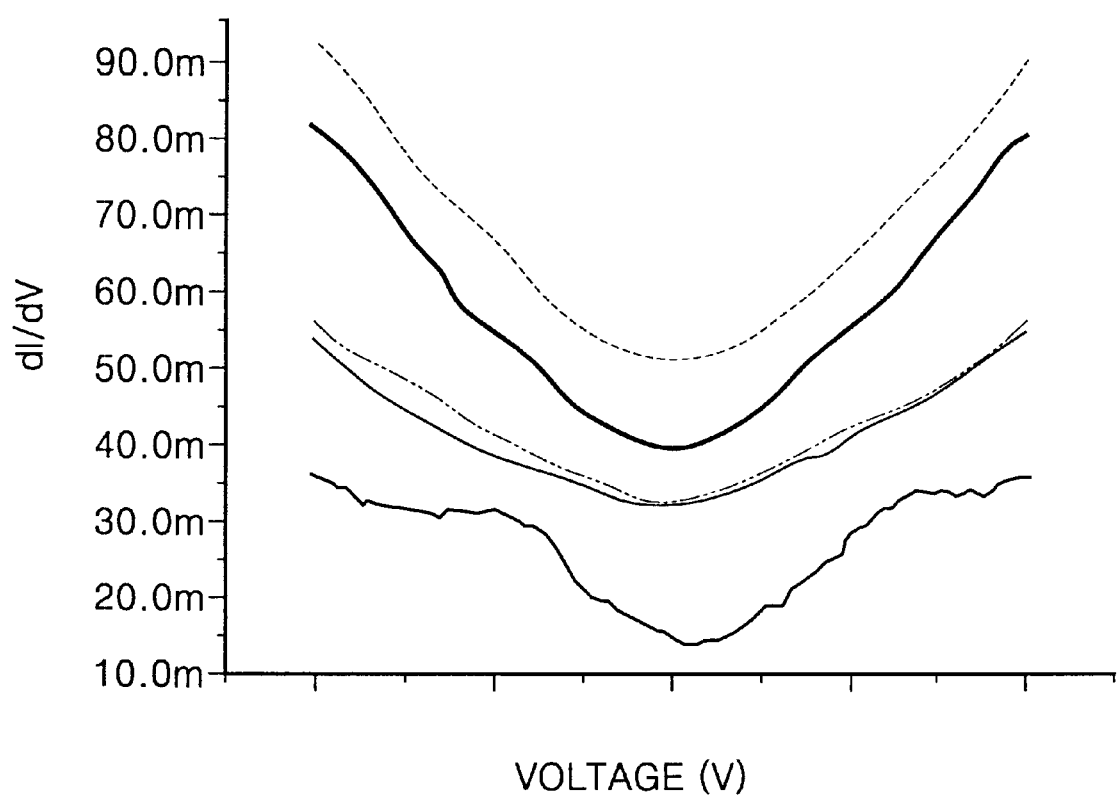

FIGS. 9A and 9B are I-V characteristic curves of carbon nanotube samples having diameters of approximately 20 nm, the carbon nanotubes having been annealed at approximately 400° C. to approximately 800° C. In detail, FIG. 9A shows a case where an oxidation layer exists under the carbon nanotubes, and FIG. 9B shows a case where no oxidation layer exists under the carbon nanotubes. It is understood that the carbon nanotubes can serve as a transistor.

As described above, in the vertical nano-sized transistor using carbon nanotubes according to an embodiment of the present invention, holes having diameters of several nanometers are formed in an insulating layer such as alumina at intervals of several nanometers to vertically align carbon nanotubes in the nano-sized holes by CVD, electrophoresis or mechanical compression, to be used as channels. Also, a gate is formed in the vicinity of the carbon nanotubes using an ordinary semiconductor manufacturing method, and then a source and a drain are formed at lower and upper parts of each of the carbon nanotubes, thereby fabricating the vertical nano-sized transistor having an electrically switching characteristic.

Therefore, a vertical type transistor of a tera-bit scale can be formed using intrinsic characteristics of carbon nanotubes to overcome the limitations of conventional semiconductor technology. The vertical nano-sized transistor using carbon nanotubes according to the present invention provides the additional benefit of low power consumption.

While the present invention has been described in terms of preferred embodiments, those of ordinary skill in the art will recognize that various modifications may be made to the invention without departing from the spirit and scope of the invention as defined by the appended claims.

What is claimed is:

1. A vertical nano-sized transistor using carbon nanotubes comprising:

an insulating layer having holes, the holes having nano-sized diameters;

carbon nanotubes vertically aligned in the holes;

gates formed over the insulating layer in the vicinity of the carbon nanotubes;

a nonconductor film deposited on the gates to fill the holes;

drains formed over the nonconductor film and the carbon nanotubes; and sources formed under the insulating layer and the carbon nanotubes.

2. The vertical nano-sized transistor using carbon nanotubes according to claim 1, wherein the insulating layer is formed of a material selected from the group consisting of $Al_2O_3$ and Si.

3. The vertical nano-sized transistor using carbon nanotubes according to claim 1, wherein the sources and the drains are formed of metal films.

* * * * *